(12) United States Patent
Kuo et al.

(10) Patent No.: US 7,102,378 B2
(45) Date of Patent: Sep. 5, 2006

(54) TESTING APPARATUS AND METHOD FOR THIN FILM TRANSISTOR DISPLAY ARRAY

(75) Inventors: Kuang I Kuo, Taichung (TW); Hsiao Tung Tien, Taichung (TW)

(73) Assignee: Primetech International Corporation, Hsinchu (TW)

( * ) Notice: Subject to any disclaimer, the term of this patent is extended or adjusted under 35 U.S.C. 154(b) by 331 days.

(21) Appl. No.: 10/717,725

(22) Filed: Nov. 19, 2003

(65) Prior Publication Data

US 2005/0024081 A1 Feb. 3, 2005

(30) Foreign Application Priority Data

Jul. 29, 2003 (TW) .............................. 92121226 A

(51) Int. Cl.
*G01R 31/00* (2006.01)

(52) U.S. Cl. ........................................ 324/770; 324/678
(58) Field of Classification Search ......... 324/678–679, 324/684, 769–770, 158.1
See application file for complete search history.

(56) References Cited

U.S. PATENT DOCUMENTS 5,561,381 A * 10/1996 Jenkins et al. .............. 324/678
6,262,589 B1 * 7/2001 Tamukai ..................... 324/770

\* cited by examiner

*Primary Examiner*—Minh N. Tang
(74) *Attorney, Agent, or Firm*—Perkins Coie LLP

(57) ABSTRACT

A testing circuit and method for thin film transistor display array, for testing the yield of a thin film transistor array is provided. The testing circuit includes an array tester, a test panel (DUT) and a sense amplifier array. The sense amplifier is composed of a plurality of trans-impedance amplifier units and a plurality of parasitic capacitance discharge circuit units. Every sense amplifier includes a trans-impedance amplifier, which is implemented by an operational amplifier, two switches and an operation capacitance. The trans-impedance amplifier is used to form an integrated circuit and the output is transmitted to a sampling/hold circuit via a switch. Also included is a parasitic capacitance discharge circuit that is used to form a discharge route for the charge of the parasitic capacitance.

15 Claims, 7 Drawing Sheets

(a)

(a)

(b)

TESTING APPARATUS AND METHOD FOR THIN FILM TRANSISTOR DISPLAY ARRAY

BACKGROUND OF THE INVENTION

1. Field of the Invention

The present invention relates to a circuit testing method. In particular, the present invention relates to a testing method for pixel storage capacitance of a thin film transistor display circuit. A reliable and precise testing result of the yield can be obtained in conditions that parasitic capacitance is much larger than a pixel capacitance.

2. Description of the Related Art

The pixels of liquid crystal display (LCD) or organic liquid crystal display (OLED) become more and more, the area of large area display also become larger and larger, the parasitic capacitance $C_{sp}$ of the source line of the thin film transistor would be much more larger than the pixel storage capacitance $C_s$. The measuring signal is too small in yield testing of quality control step, so that the accuracy is not good enough.

Generally, to measure the yield of the pixel capacitance, it is always to charge the pixel capacitance with a voltage of several volts. However, the parasitic capacitance is also charged simultaneously, and the signal is difficult to separate. A Taiwan patent with application number of 88108530 (publishing number: 473622) from Asia of a Japanese company, title: "A testing method and apparatus for thin film transistor" is an example. Refer to FIG. 1, FIG. 1 is an equivalent circuit for testing pixel capacitance of a prior art, where $C_s$ is the pixel capacitance, $C_{sp}$ is the parasitic capacitance of the source line of the TFT array, and $C_{sp} >> C_s$, $\Delta C_s$ is a standard capacitance of known value. $S_1$ is the connection switch of $C_{sp}$ and $\Delta C_s$, $S_2$ is the pixel switch transistor. As shown in FIG. 1(a), in the first stage, charging the pixel capacitor $C_s$ to $V_p$, then switch OFF the pixel switch transistors, then charging the parasitic capacitance to $V_s$, where $V_s \neq V_p$, in the mean time, the additive capacitor $C_T$, which is in parallel with the pixel capacitor is also charged. Next switch ON $S_2$ during testing, measuring the voltage $V_{a1}$ of the parallel capacitors $C_s \| C_{sp} \| C_T$. The voltage difference of $\Delta V_s$ between $V_{a1}$ and $V_s$ is very small, now $\Delta V_{s1} = V_{a1} - V_s = C_s/C_T * (V_p - V_s)$, because $V_{a1}$, $V_s$, $C_T$ and $V_p$ are known, then $C_s$ can be calculated, but the error is large, so that a second stage measurement is required as shown in FIG. 1(b). Set $S_1$ ON to charge $C_{sp}$, in the mean time, $V_s$ also charge to $\Delta C_s$, i.e. charge to $C_{sp} \| \Delta C_s \| C_T$, where $\Delta C_s$ is a standard capacitance of known value. Finally, set $S_2$ ON, measuring the voltage $V_{a2}$ of the parallel capacitors $C_s \| C_{sp} \| C_T$, and $\Delta V_{s2} = V_{a2} - V_s = C_s/C_T * (V_p - V_s)$, according to the values of $\Delta V_{s1}$ and $\Delta V_{s2}$, the value of $C_s$ can be calculated as follow:

$$C_s = \Delta C_s * \Delta V_{s1} * \Delta V_{s2} / \{(V_p - V_s) * (\Delta V_{s1} - \Delta V_{s2})\}$$

This prior art method needs a two stage measurement, must take a long time, the signal is also too weak, the reliability is not enough and the accuracy is also bad, may not meet the requirement of the industry.

What is needed is an improved testing method satisfied the need of testing small pixel capacitor and still has a stronger signal to increase the accuracy and reliability.

It also need an improved testing method satisfied the need of obtaining a result with one testing step for each pixel capacitor to save time and manpower.

OBJECTS OF THE INVENTION

It is therefore an object of the invention to provide a testing method for thin film transistor display array, for testing the small value of a pixel capacitor in parallel to the large parasitic capacitance of the source line of the thin film transistor array using a charge transfer method to transfer the charge of the parasitic capacitance, then a stronger signal can be obtained to increase the accuracy and reliability.

It is another object of the invention to provide a testing method for thin film transistor display array, a result can be obtained with one testing step for each pixel capacitor to save time and manpower.

DISCLOSURE OF THE INVENTION

A first aspect of the present invention teaches a testing circuit for thin film transistor display array testing, use to test the yield of thin film transistor array, comprising: An array tester, providing electrical power, testing signal wave-form, for analyzing, calculating, storing the testing results; A device under test (DUT) platform, for holding the thin film transistor array, and providing control signal to the platform and the sense amplifier by the array tester; A sense amplifier array, for transferring (discharge) the parasitic capacitance of the source line of the thin film transistors and integrating the charge current of the pixel storage capacitor, wherein the improvement comprising: Said sense amplifier array is composed by a plurality of trans-impedance amplifier unit and a plurality of parasitic capacitance discharge circuit, every sense amplifier including: A trans-impedance amplifier, is composed by an amplifier, two switches and an operation capacitor; said operation capacitor feed back the output of the amplifier to the negative input of the amplifier; a switch connecting to the output and negative input of the operational amplifier, to short circuit the operation capacitor for discharge; another switch to be the input switch, to connect or disconnect with the pixel storage capacitor; said trans-impedance amplifier forms an integrated circuit, the output is transmitted to a sampling/hold circuit via an output switch and converted to a digital signal; A discharge circuit for the parasitic capacitance of the source line of the thin film transistors, composed by an amplifier, two switches and an operation capacitor, said operation capacitor feed back the output of the amplifier to the negative input of the amplifier; a switch connecting to the output and negative input of the operational amplifier, to short circuit the operation capacitor for discharge; another switch to be the input switch, to connect or disconnect with the parasitic capacitance of the source line of the thin film transistors; a load resistance connecting the output of said operational amplifier to the ground; said discharge circuit forms a discharge circuit for the parasitic capacitance.

A second aspect of the present invention teaches a testing method for invalid pixel (invisible area) of thin film transistor display array, comprising the steps of: Charging the pixel storage capacitors of the nth column of the device under test to a charge voltage of $V_s$, then open circuit the pixel transistors after charging; Switching ON the short circuit switches of the sense amplifiers and the discharge circuits to discharge the operation capacitors of the sense amplifiers and the discharge circuits; Switching ON the input switches of the discharge circuits; switching OFF the short circuit switch to discharge the parasitic capacitance of the thin film transistor (transfer the charge), the transferring time is longer; Switching ON the input switch of the sense amplifier to start operation of the sense amplifier, integrating the current from the pixel storage capacitor of column n and row k, but do not output the result; Testing the next pixel (column n and row (k+1)).

A third aspect of the present invention teaches a testing method for valid pixel (visible area) of thin film transistor display array, comprising the steps of: Charging the pixel storage capacitors of the nth column of the device under test to a charge voltage of $V_s$, then open circuit the pixel transistors after charging; Switching ON the short circuit switches of the sense amplifiers and the discharge circuits to discharge the operation capacitors of the sense amplifiers and the discharge circuits; Switching ON the input switch of the sense amplifier to start operation of the sense amplifier, integrating the current from the pixel storage capacitor of column n and row k, the integrated voltage is $V_d$; Switching ON the input switches of the discharge circuits; switching OFF the short circuit switch to discharge the parasitic capacitance of the thin film transistor (transfer the charge), for the testing of the next pixel, the transferring time is shorter;

BRIEF DESCRIPTION OF THE DRAWINGS

The foregoing and other advantages of the invention will be more fully, understood with reference to the description of the best embodiment and the drawing wherein.

DESCRIPTION OF THE PREFERRED EMBODIMENTS

Figure 1:
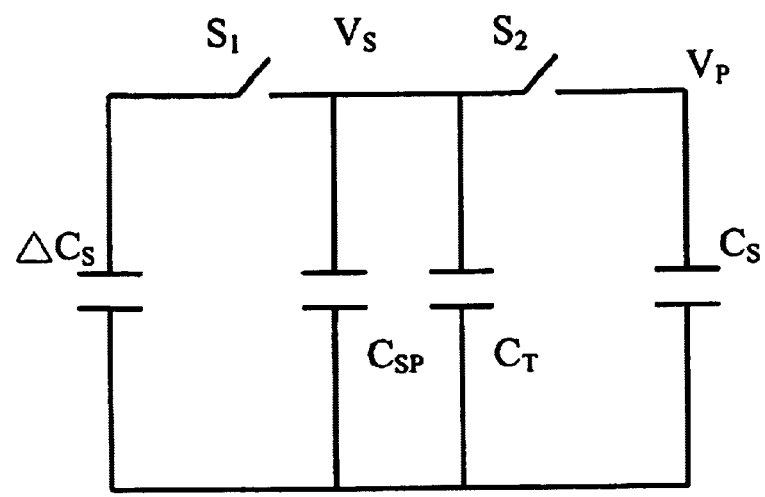
FIG. 1 (prior art) is an equivalent circuit for testing pixel capacitance.
Figure 1:
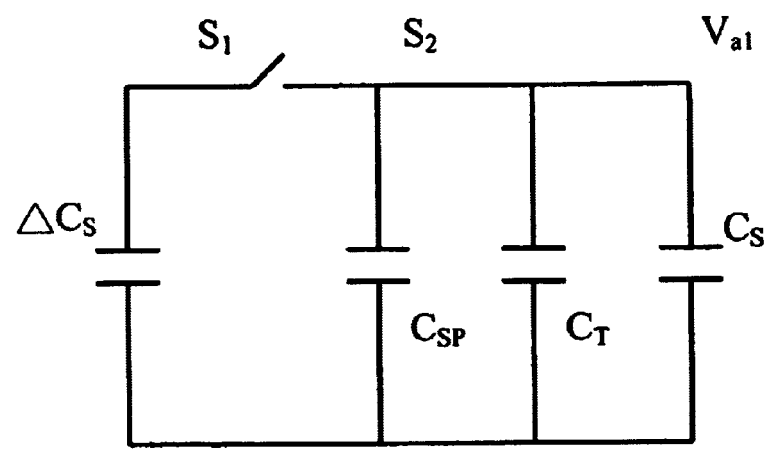
Figure 2:
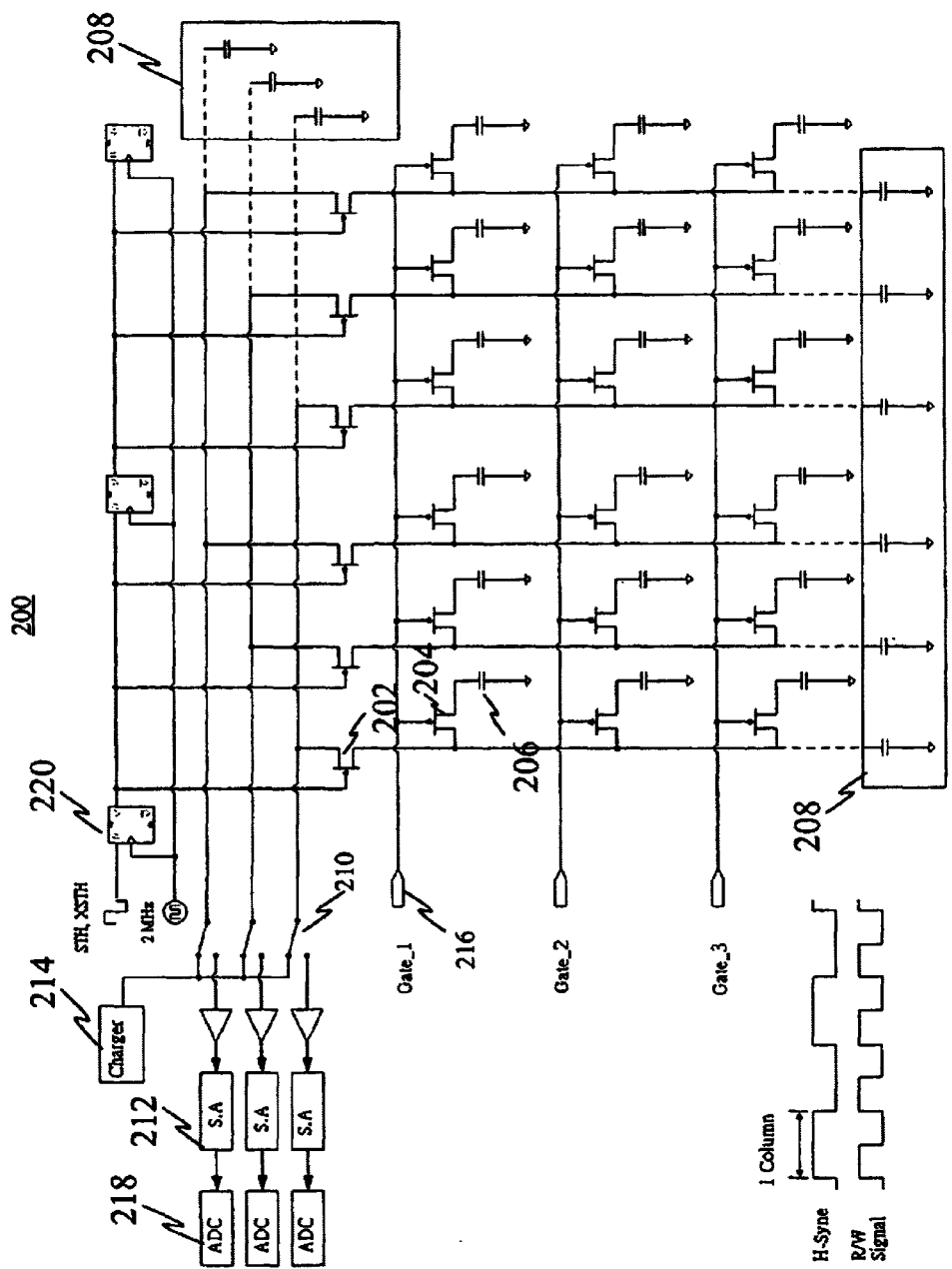
FIG. 2 is a connection block diagram of a testing circuit for low temperature poly-Si thin film transistor array 200 in according to one embodiment of the present invention.

Referring to FIG. 2, FIG. 2 is a connection block diagram of a testing circuit for low temperature poly-Si thin film transistor array 200 in according to one embodiment of the present invention. The gate of the column switching-transistor 202 (or the read/write switching transistor) is controlled to switch ON or switch OFF by the gate control circuit 220 of the column switching-transistor 202, to connect the column, for example column n (n=1 to N, N is the total column) from the source/drain to the DC charging source or the testing circuit, the gate of the pixel switching transistor 204 is connected to the row switching-transistor 216 of row k (k=1 to K, K is the total row), the source of the pixel switching transistor 204 is connected to the drain of the column switching-transistor 202, and the drain of the pixel switching transistor 204 is connected to the positive electrode of the pixel capacitor, the negative electrode of the pixel capacitor is connected to the common of the array ($C_s$ on common) or connected to the gate control point of column (k+1) ($C_s$ on gate). Both the sources of the column switching-transistor and the pixel switching-transistor have their source line parasitic capacitor $C_{sp}$ 208, its value is much more larger than the pixel capacitor $C_s$ ($C_{sp} \gg C_s$), and the time constant of charge and discharge is very large. The source of the switching transistor 202 of column 1 is connected to a switch 210, which connected to DC charge source 214 if switching upward, or connected to sense array 212 if switching downward. The gate of the switching transistor 202 of column 1 is connected to control circuit 220 of the column switch. Sense array 212 is one of the particular of the present invention, will descript in FIG. 4. The output of the sense array 212 is connected to a sampling and hold circuit of the A/D converter (ADC) 218 to transmit the signal to the array tester.

Figure 3:
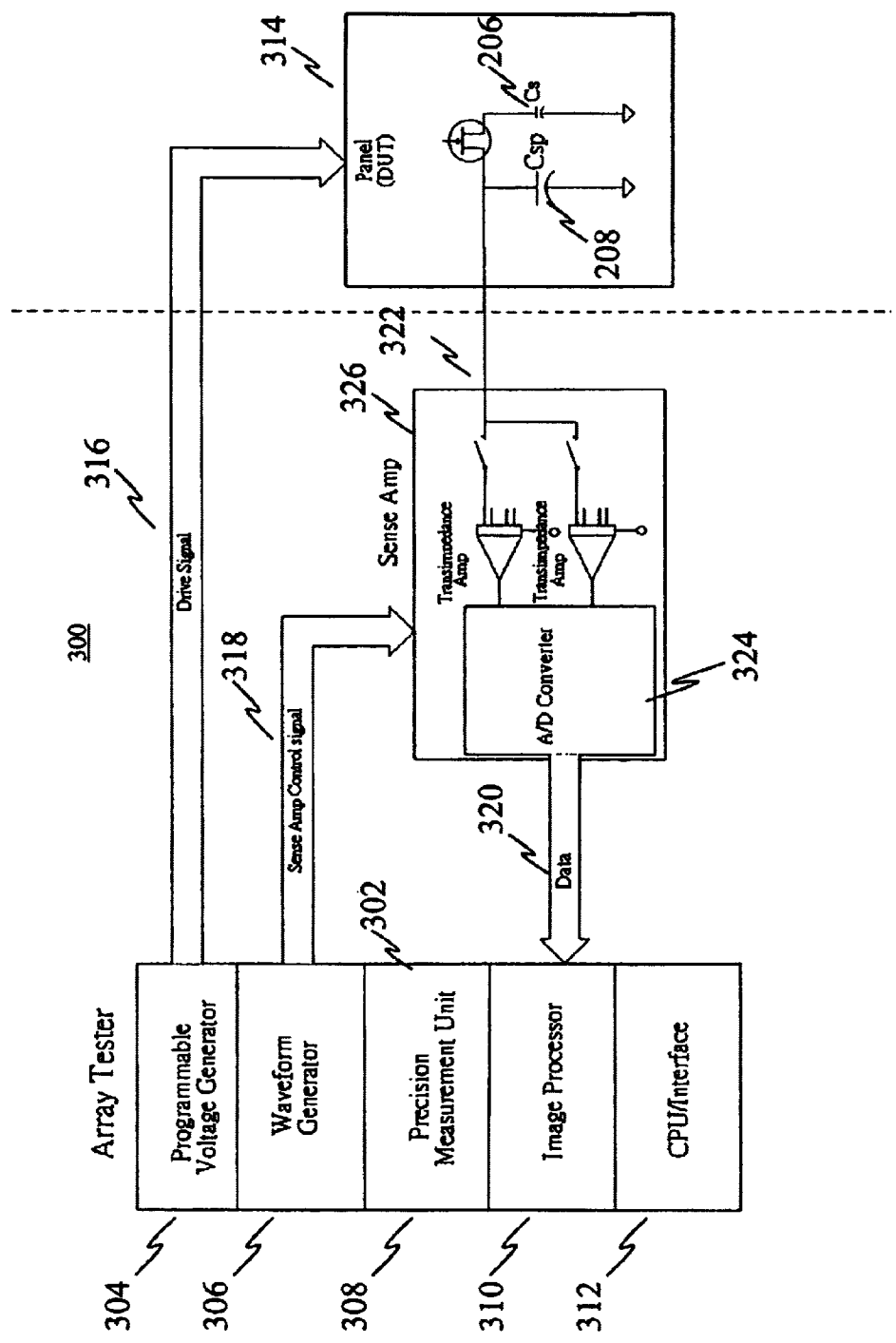
FIG. 3 is a connection block diagram 300 of the array tester and the DUT (device under test) in according to one embodiment of the present invention.

FIG. 3 is a connection block diagram 300 of the array tester and the DUT (device under test) in according to one embodiment of the present invention. Array tester 302 including a programmable voltage generator 304, waveform generator 306, precision measurement unit 308, pixel processor 310 and central processing unit/interface 312. Driving signal 316 generated from the programmable voltage generator supplying the necessary voltage to DUT 314, for example, the charge voltage, the driving voltage of the transistors, etc. The device under test could be, for example, liquid crystal display (LCD) panel, organic light emitting diode display (OLED) panel or LCOS (liquid crystal on silicon) panel. The transistor could be, for example, amorphous thin film transistor, poly-Si thin film transistor or re-crystallized silicon thin film transistor. The waveform generator 306 generates the necessary sense amplifier control signal 318 to control the testing performance of the sense amplifier 326. The signal of the pixel transistor is transmitted to the sense amplifier 326 of the sense array 212 from switch 210 (refer to FIG. 2) via wire 322, The sensed signal transmit to an A/D converter 324 via a sampling/hold circuit (not shown), then converted to a digital signal, the digital signal is then transmitted to a pixel processor 310 for analyzing via data bus 320, CPU 312 calculates the testing results to form a report or a table for the tester to explain the test results. The circuit connection of FIG. 3 is not much different to the prior art, only the structure of the sense amplifier is different and the testing method is not the same.

Figure 4:
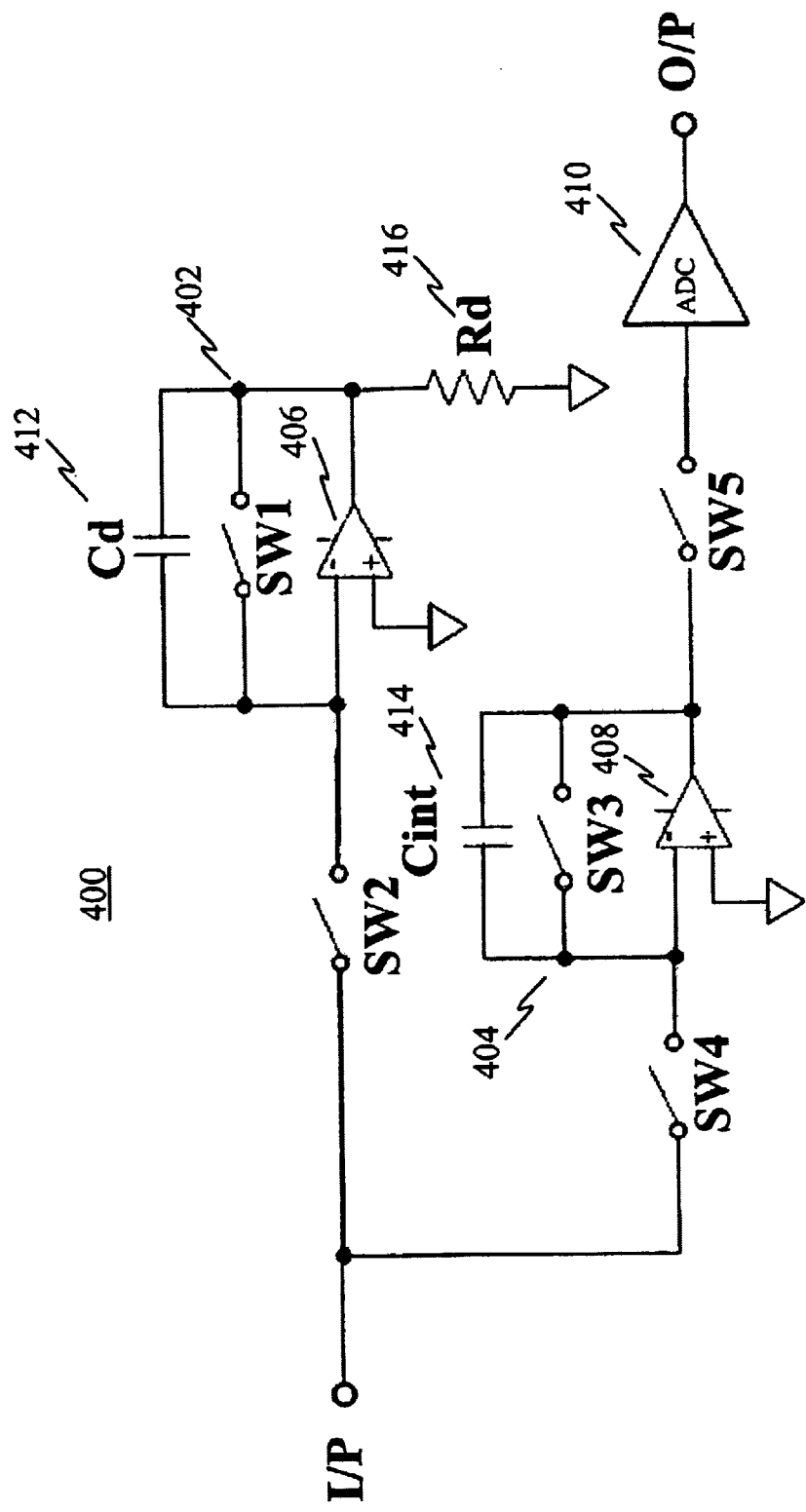
FIG. 4 illustrates an electric circuit of the sense amplifier 400 in according to one embodiment of the present invention.

FIG. 4 illustrates an electric circuit of the sense amplifier 400 in according to one embodiment of the present invention. A plurality of sense amplifier 400 forms a sense amplifier array 212. Every sense amplifier including: a trans-impedance amplifier 404, a parasitic capacitance discharge circuit 402, A/D converter 410 and switches SW1, SW2, SW3, SW4 and SW5. The discharge circuit for the parasitic capacitance is an integrator, is implementing an operational amplifier 406, an operation capacitor $C_d$ 412, SW1 and a load resistor 416, The value of the operation capacitor $C_d$ 412 is more than 10 pF. The input is connected to the negative input of the operational amplifier 406 via SW2, the positive input is ground, the negative input is connected to the output by SW1 as well as $C_d$ 412, the output is connected to a load resistor 416 then to ground. When SW1 is ON, $C_d$ 412 will discharge. When SW2 ON, the charge of the parasitic capacitance from the input will perform transformation, i.e., to discharge the parasitic capacitance. The trans-impedance amplifier 404 is an integrator, is implementing an operational amplifier 408, an operation capacitor $C_{int}$ 414 and SW3. The input is connected to the negative input of the operational amplifier 408 via SW4, the positive input is ground, the negative input is connected to the output by SW3 as well as $C_{int}$ 414, the output is connected to an A/D converter 410 with sampling/hold circuit via SW5, the output (O/P) of the A/D converter 410 providing the signal to pixel processor. When SW3 is ON, the charge of $C_{int}$ 414 will discharge. When SW3 is OFF, SW4 and SW5 is ON, the charge current from the pixel storage capacitor can be integrating, then transmit to the A/D converter 410 via the sampling/hold circuit, which will transform to a digital signal.

Figure 5:
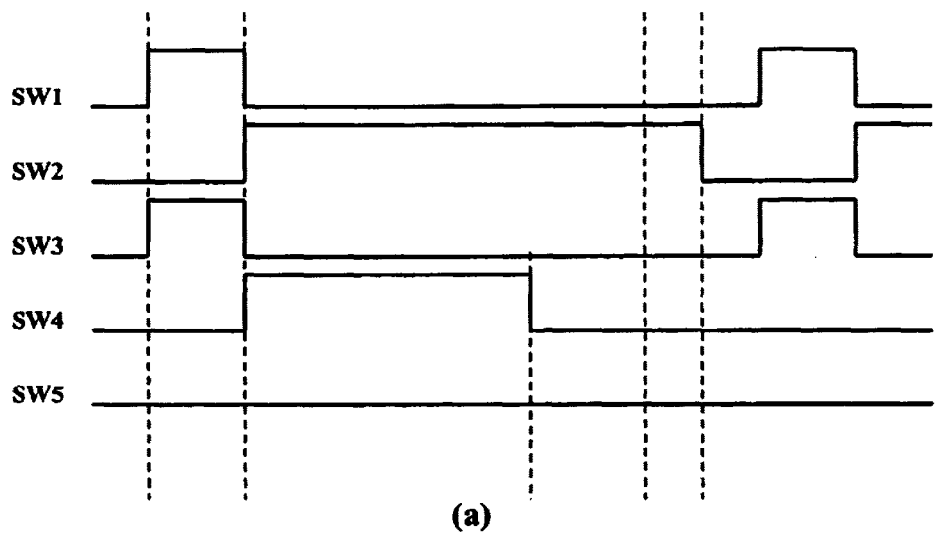
FIG. 5 is the control waveform for controlling SW1 to SW5 to test one pixel capacitance.
Figure 5:
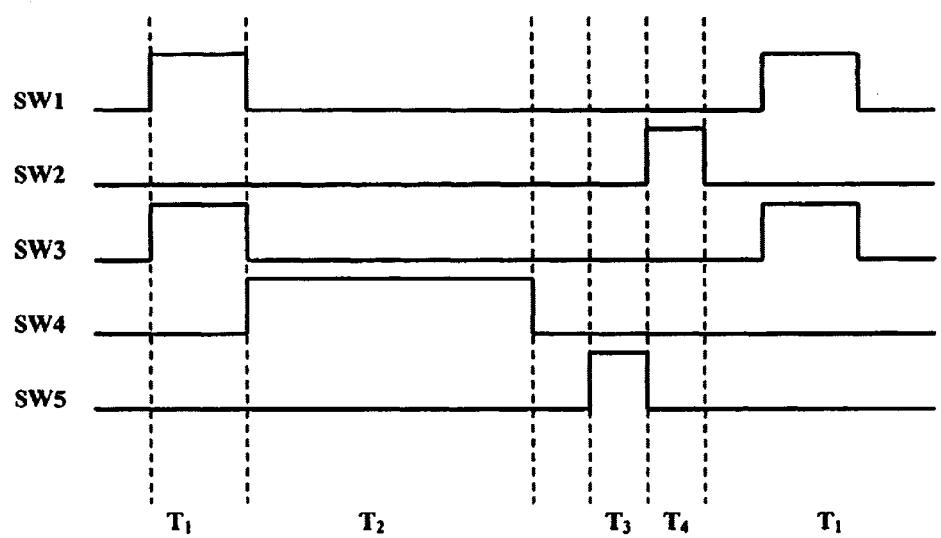

FIG. 5 is the control waveform for controlling SW1 to SW5 to test one pixel capacitance. FIG. 5(*a*) is the control waveform for the invalid pixel (invisible area) and FIG. 5(*b*) is the control waveform for the valid pixel (visible area). The operation will explain in the following description.

Figure 6:
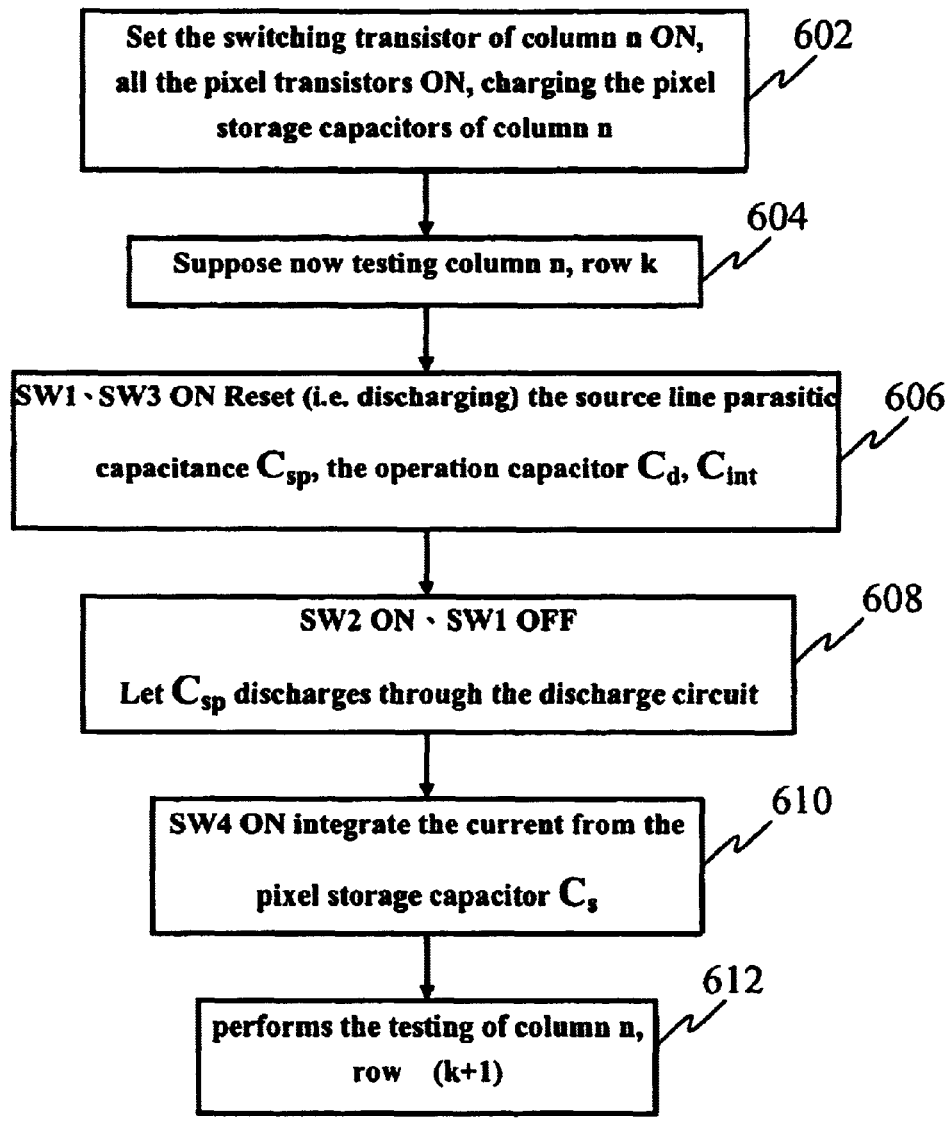
FIG. 6 is the flow chart for testing the invalid pixel (invisible area) in according to one embodiment of the present invention.

FIG. 6 is the flow chart for testing the invalid pixel (invisible area) in according to one embodiment of the present invention. First in step 602, please refer to FIG. 2, set the switching transistor of column n ON, all the pixel transistors ON, connecting switch 210 to the DC charge source for charging the pixel storage capacitors of column n, OFF all the pixel transistors after charged, then connecting switch 210 to one of the sense amplifier 400 (FIG. 4) of the sense amplifier array 212. Coming back to FIG. 6, in step 604, suppose now testing column n, row k. In step 606, using period $T_1$ of the test waveform of FIG. 5(*a*), now SW1 and SW3 are ON, refer to FIG. 4, reset (i.e. discharge) the source line parasitic capacitance $C_{sp}$, the operation capacitor $C_d$, $C_{int}$ of the discharge circuit 402 and the sense amplifier 404 respectively. In step 608, set SW2 ON, SW1 OFF in period $T_2$ of FIG. 5, let the current from $C_{sp}$ discharges through the discharge circuit 402. This is also charge transfer. This step is testing the invalid pixel, the result is not necessary, but testing must go through this pixel, so that it is a chance to discharge for a longer time (i.e. SW2 ON for a longer time) so that the parasitic capacitance $C_{sp}$ has enough time to discharge. In step 610, set SW4 ON in period $T_2$ of FIG. 5, now start the sense amplifier 404 and set the pixel transistor 204 ON (FIG. 2) to integrate the current from the pixel storage capacitor $C_s$. Note that the time of operation is overlap with the time for the discharging of $C_{sp}$ (refer to the control waveform of FIG. 5). If it is not necessary to test the invalid pixel, this step can be neglect, SW4 need not ON, as the doted line of SW4 shown in FIG. 5(*a*). In step 612, performs the testing of column n, row (k+1).

Figure 7:
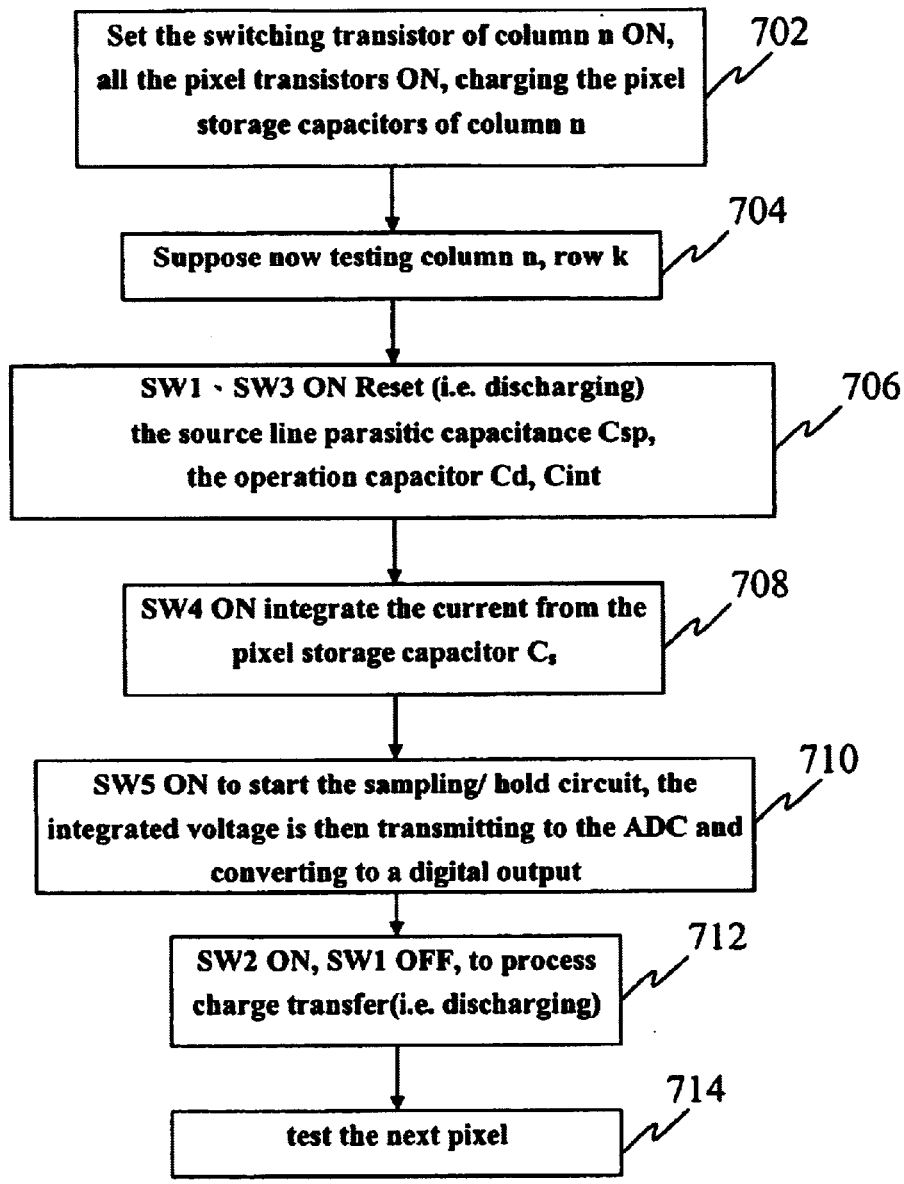
FIG. 7 is the flow chart for testing the valid pixel (visible area) in according to one embodiment of the present invention.

FIG. 7 is the flow chart for testing the valid pixel (visible area) in according to one embodiment of the present invention. Steps 702 and 704 are the same as steps 602 and 604. In step 706, using period $T_1$ of the test waveform of FIG. 5(*b*), now SW1 and SW3 are ON, refer to FIG. 4, reset (i.e. discharge) the source line parasitic capacitance $C_{sp}$, the operation capacitor $C_d$, $C_{int}$ of the discharge circuit 402 and the sense amplifier 404 respectively. In step 708, set SW4 ON in period $T_2$ of FIG. 5 to start the sense amplifier 404. Refer to FIG. 2, now set the pixel transistor 204 of column n, row k ON, to Integrate the current from the charge of the pixel storage capacitor 206. The integrated voltage is larger than 100 mV. This signal voltage is a number of hundred times greater than the results obtained by the prior art. The reliability is increased. Only one testing is enough to get a précised result for each pixel. This will save manpower and time. In step 710, in the period $T_3$ of FIG. 5, set SW5 ON to start the sampling/hold circuit, the integrated voltage is then transmitting to the ADC and converting to a digital output for process by the pixel processor 310, in step 712, in the period $T_4$ of FIG. 5, set SW2 ON, SW1 OFF, to process charge transfer. The object of this step is as follow: When the pixel storage capacitor discharging to the sense amplifier 404, it also charging the source line of column n very little. As k is increasing, the charge in the parasitic capacitance of column n will accumulate, this will affect the precision of testing. This step is to correct such phenomena. It is value to note that the discharge period is obviously decreased as compare to the discharge period of the invalid pixels in order to decrease testing time and increase testing efficiency. Step 712 is to prepare the measurement of the next pixel (i.e., column n, row (k+1). Because the transfer is done, testing may immediately go to step 714 to test the next pixel.

Although specific embodiments of the invention have been disclosed, it will be understood by those having skill in the art that minor changes can be made to the form and details of the specific embodiments disclosed herein, without departing from the spirit and the scope of the invention. The embodiments presented above are for purposes of example only and are not to be taken to limit the scope of the appended claims.

What is claimed is:

1. A testing circuit for thin film transistor display array testing, use to test the yield of thin film transistor display array, comprising:

An array tester, providing electrical power, testing signal wave-form, for analyzing, calculating, storing testing results;

A device under test (DUT) platform, for holding the thin film transistor display array, and providing control signal to the platform and a sense amplifier by the array tester;

A sense amplifier array, for transferring (discharge) the parasitic capacitance of the source line of the thin film transistors and integrating charge current of a pixel storage capacitor:

wherein said sense amplifier array is composed by a plurality of trans-impedance amplifier units and a plurality of parasitic capacitance discharge circuits, the sense amplifier array including:

A trans-impedance amplifier, is composed by a first operational amplifier, first switch, a second switch and a first operation capacitor; said first operation capacitor feed back the output of the first operational amplifier to the negative input of the first operational amplifier; the first switch connecting to the output and negative input of the first operational amplifier, to short circuit the first operation capacitor for discharge; the second switch to be the input switch, to connect or disconnect with the pixel storage capacitor; said trans-impedance amplifier forms an integrated circuit, the output of the first operational amplifier is transmitted to a sampling/hold circuit via an output switch and converted to a digital signal;

A discharge circuit for the parasitic capacitance of the source line of the thin film transistors, composed by a second operational amplifier, third switch, a fourth switch and a second operation capacitor; said second operation capacitor feed back the output of the second operational amplifier to the negative input of the second operational amplifier; the third switch connecting to the output and negative input of the second operational amplifier, to short circuit the second operation capacitor for discharge; the fourth switch to be the input switch, to connect or disconnect with the parasitic capacitance of the source line of the thin film transistors; a load resistance connecting the output of the second operational amplifier to the ground; said discharge circuit forms a discharge route for the parasitic capacitance.

2. A testing circuit as recited in claim 1, wherein said thin film transistor display array is liquid crystal display (LCD) panel.

3. A testing circuit as recited in claim 1, wherein said thin film transistor display array is organic light emitting diode display (OLED) panel.

4. A testing circuit as recited in claim 1, wherein said thin film transistor display array is LCOS (liquid crystal on silicon) panel.

5. A testing circuit as recited in claim 1, wherein said thin film transistor display array is formed by amorphous thin film transistors.

6. A testing circuit as recited in claim 1, wherein said thin film transistor display array is formed by poly-Si thin film transistor.

7. A testing circuit as recited in claim 1, wherein said thin film transistor display array is formed by re-crystallized silicon thin film transistor.

8. A testing circuit as recited in claim 1, wherein said amplifier is an operational amplifier.

9. A testing circuit as recited in claim 1, where in said first second, third and fourth switches are control by the programmable output waveform of said array tester.

10. A testing circuit as recited in claim 1, wherein the capacitance of said operation capacitor of said trans-impedance amplifier is 1 pf to 100 pf.

11. A testing circuit as recited in claim 1, wherein the capacitance of said operation capacitor of said discharge circuit is greater than 10 pf.

12. A testing method for invalid pixel (invisible area) of thin film transistor display array, comprising the steps of:

Charging the pixel storage capacitors of nth column of the thin film transistor display array through a pixel switch transistors to a charge voltage of $V_s$, then open circuit the pixel switch transistors after charging;

Switching ON short circuit switches of sense amplifiers and discharge circuits to discharge the operation capacitors of the sense amplifiers and the discharge circuits;

Switching ON input switches of the discharge circuits; switching OFF short circuit switches to discharge the parasitic capacitance of the thin film transistor display array (transferring the charge);

Switching ON input switches of the sense amplifiers to start operation of the sense amplifiers, integrating any current from a pixel storage capacitor of column n and row k, but do not output the result of the integrated current;

Testing a next pixel (column n and row (k+1)).

13. A testing method for valid pixel (visible area) of thin film transistor display array, comprising the steps of:

Charging the pixel storage capacitors of nth column of the thin film transistor display array through a pixel switch transistors to a charge voltage of $V_s$, then open circuit the pixel switch transistors after charging;

Switching ON short circuit switches of sense amplifiers and discharge circuits to discharge the operation capacitors of the sense amplifiers and the discharge circuits;

Switching ON the input switches of sense amplifiers to start operation of the sense amplifier, integrating any current from a pixel storage capacitor of column n and row k, to integrate a voltage Vd;

Switching ON the input switches of discharge circuits; switching OFF the short circuit switch of discharge circuits to discharge the parasitic capacitance of the thin film transistor display array (transferring the charge), for testing of a next pixel, Testing the next pixel (column n and row (k+1)).

14. A testing method as recited in claim 12 or 13, wherein said charging voltage $V_s$ of the pixel capacitors is 2 Volts to 10 Volts.

15. A testing method as recited in claim 13, wherein said integrated voltage $V_d$ is greater than 100 mV.

* * * * *